United States Patent [19]

Endo et al.

[11] 4,360,562
[45] Nov. 23, 1982

[54] LAMINATED ELECTRIC ELEMENTS

[75] Inventors: Yasushi Endo; Seiichi Suzuki, both of Iwaki, Japan

[73] Assignee: Kureha Kagaku Kogyo Kabushiki Kaisha, Tokyo, Japan

[21] Appl. No.: 266,092

[22] Filed: May 21, 1981

[30] Foreign Application Priority Data

Feb. 24, 1980 [JP] Japan .................... 55-71822[U]

[51] Int. Cl.³ ............................. B32B 7/00; B32B 7/12
[52] U.S. Cl. ................................. 428/317.7; 428/213;
428/319.1; 428/319.3; 428/319.7; 428/332;
428/333; 428/334
[58] Field of Search ........... 200/86 R, 159 B, DIG. 1;
428/213, 215, 314.4, 314.8, 316.6, 317.1, 317.3,
317.5, 317.7, 319.1, 319.3, 319.7, 332, 333, 334

[56] References Cited

U.S. PATENT DOCUMENTS

| | | | |
|---|---|---|---|
| 3,467,569 | 9/1969 | Weber et al. | 428/319.1 |
| 3,640,832 | 2/1972 | Kurz | 428/319.1 |
| 3,847,724 | 11/1974 | Powers et al. | 428/317.7 |
| 3,854,983 | 12/1974 | Brodnyan | 428/314.2 |
| 4,054,710 | 10/1977 | Botsolas | 428/317.7 |
| 4,131,703 | 12/1978 | Voet | 428/319.1 |
| 4,137,116 | 1/1979 | Miller | 428/319.1 |
| 4,169,184 | 9/1979 | Pufahl | 428/317.3 |
| 4,194,099 | 3/1980 | Mickelson | 200/86 R |
| 4,258,096 | 3/1981 | La Marche | 200/86 R |
| 4,321,297 | 3/1982 | Adelman | 428/314.4 |

*Primary Examiner*—William J. Van Balen
*Attorney, Agent, or Firm*—Woodcock, Washburn, Kurtz, Mackiewicz & Norris

[57] ABSTRACT

The laminated electric element is composed of a plastic film having at least one of electric properties including dielectric, pyroelectric and piezoelectric properties, and carrying a conductive layer on at least one surface thereof, the plastic film being laminated with a foam layer. Between the plastic film having the conductive layer and the foam layer is provided a middle layer to permit a flat surface on the conductive layer-carrying plastic film. The provision of the middle layer can render the surface of the conductive layer-carrying plastic film or layer flat without causing deformation on the surface thereof by the curved or waved surface of the foam layer and permit an effective utilization of such electric properties in addition to an effective prevention of the electrode layer provided thereon from coming off. Where the electrode layer is provided inside the conductive layer-carrying plastic film, the corrosion of the electrode layer can be prevented effectively.

The laminated electric elements having such structure as set forth hereinabove can be employed for a capacitive switch, an infrared sensor, an acoustic transducer or the like.

26 Claims, 5 Drawing Figures

LAMINATED ELECTRIC ELEMENTS

BACKGROUND OF THE INVENTION

1. Field of the Invention

The present invention relates to a laminated electric element and, more particularly, to a laminated electric element which contains a plastic film provided on one surface or both surfaces thereof with a conductive layer, and a foam layer laminated on the plastic film through a middle layer.

2. Brief Description of the Prior Art

A variety of electric elements utilizing electric properties of plastic films have been developed and commercialized. The term "electric properties" referred to herein and throughout the specification unless otherwise stated may include not only electric properties inherent in plastic films, such as dielectric constant and electric resistance, but other electric properties acquired a posteriori, such as electret properties (performance with respect to charges on the surface of plastic film) produced therein by treating the plastic film, for example, under high direct current electric field, and piezoelectric and pyroelectric properties.

Electric elements are used usually by bringing the plastic films into contact with or taking them away from electrodes for the input and the output of electric signals or a common electrode for capacity coupling or a covering for such electrodes. The plastic film may often be employed in the form of a metallized plastic film which comprises a base plastic film and a thin metal film or conductive layer deposited on one surface or on both surfaces thereof as an electrode layer.

One of the purposes for using the metallized film is to utilize properties that the film is so soft or flexible that it is likely to be varied in form with a stress. In order to produce a stress readily in the film by applying a pressure thereto or to provide the film with a cushioning effect, a material, such as a plastic foam, which can act as a cushioning material and has an inwardly and outwardly curved or waved surface, may have been employed by depositing an electrode layer or conductive layer thereon.

Where the plastic film in the electric element has a thickness thicker than a certain level which is to be determined in accordance with a Young's modulus, on the one hand, the surface of the plastic film can be held flat without being subject to deformation resulting from the curved surface of a foam layer laminated thereon. If the plastic film has a thickness thinner than such certain level, on the other hand, the surface of the flexible or soft plastic film may become curved or waved along with the curved surface of the foam layer, whereby the electrode layer or conductive layer deposited on the plastic film also becomes curved or waved.

The curved or waved plastic film and/or electrode layer may adversely affect performance as a laminated electric element. Where it is employed with an infrared sensor, an infrared image to be formed on the metal film or conductive layer may tend to become blurred or faded. With an acoustic transducer which is provided with such waved film and/or layer, sounds may tend to become warped or deflected. A capacitive switch employing such curved or waved plastic film and/or electrode layer may tend to provide no desired electric capacity. In each case, there may be a tendency that the electrode layer tends to come off because it is attached to the plastic layer with a relatively weak adhesive force.

SUMMARY OF THE INVENTION

Therefore, an object of the present invention is to provide a laminated electric element capable of maintaining its flat surface without undergoing an influence from the curved or waved surface of a foam layer even if a plastic film having a conductive layer is relatively thin.

Another object of the present invention is to provide a laminated electric element having a thin plastic film with a conductive layer, which can effectively utilize the electric properties of the plastic film.

A further object of the present invention is to provide a laminated electric element having an electrode layer which does not come off easily.

A still further object of the present invention is to provide a laminated electric element which is arranged in a manner such that a conductive layer formed at the side of a foam layer on the plastic film does not tend to corrode.

Various other objects, advantages and features of the present invention will become readily apparent from the ensuring detailed description, and the novel features will be particularly pointed out in the appended claims.

In accordance with the present invention, there is provided an electric element in which a middle layer is disposed or interposed between a plastic film having a conductive layer on at least one surface thereof and a foam layer having a curved and waved surface, whereby flatness on the surfaces of the plastic film and/or the conductive layer can be maintained without undergoing an influence from the waved or curved surface of the foam layer.

DETAILED DESCRIPTION OF THE PREFERRED EMBODIMENTS

Figure 1:
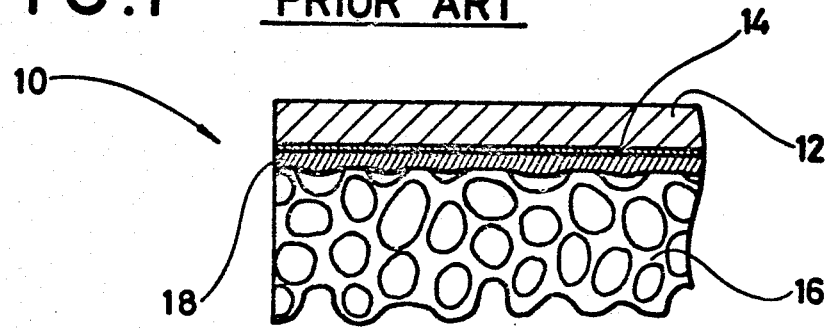
FIG. 1 is a longitudinal cross sectional view illustrating a portion of a known laminated electric element in which a thick metal film is used.
Figure 2:
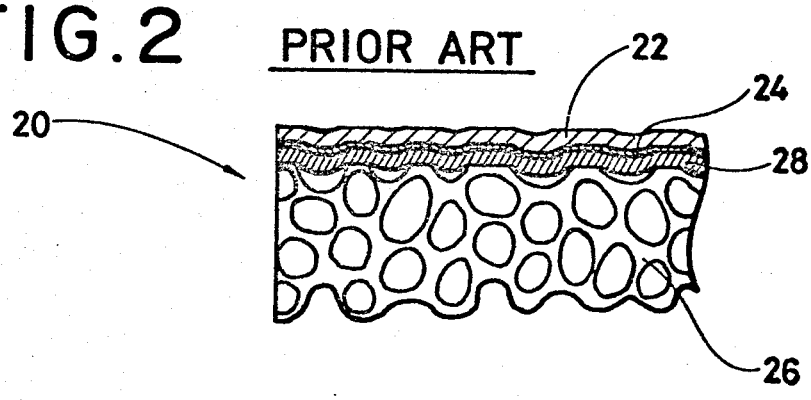
FIG. 2 is a longitudinal cross sectional view illustrating a portion of another known laminated electric element in which a thin metal film is used.

The electric elements in accordance with the present invention will be described in more detail with comparison to known laminated electric elements as shown in FIGS. 1 and 2.

A known laminated electric element 10, as shown in FIG. 1, comprises a relatively think plastic film 12 provided or deposited on one side thereof with an electrode layer 14. The metallized or conductive layer-carrying plastic film 12 is laminated on a foam layer 16 by allowing the surface of the electrode layer to adhere to the surface of the foam layer with an adhesive layer 18.

The term "metallized plastic film" referred to throughout the specification is intended to mean a plastic film provided on at least one surface thereof with a metal film or layer or conductive layer as an electrode layer.

In the known laminated electric element 10 as shown in FIG. 1, the plastic film 12 which has a thickness thicker than a certain level when determined in accordance with the Young's modulus of the film is laminated on the foam layer 16 having an inwardly and outwardly curved or waved surface so that the conductive layer-carrying or metallized plastic film can keep its flatness on the surface thereof without undergoing little influence from the curved or waved surface of the foam layer.

FIG. 2 illustrates another known laminated electric element 20 which is similar in laminated structure to the element 10 as shown in FIG. 1 with the exception that, in place of the thick plastic film 12, a plastic film 22 is employed which has a thickness thinner than that of the plastic film 12 and than a certain thickness when determined with respect to the Young's modulus. Accordingly, where such thin conductive layer-carrying or metallized plastic film is laminated on the curved or waved surface of the foam layer 26, the surface of the plastic film is also rendered curved or waved. As set forth hereinabove, such deformation of the plastic film may result in a similar deformation of the electrode layer 24 deposited on the plastic film.

It is found that such deformation of the plastic film 22 and/or the electrode layer 24 may cause various drawbacks or disadvantages as a laminated electric element, as will hereinafter be described more in detail.

Where such known electric element is applied to an infrared sensor in which a plastic film having both piezoelectric and pyroelectric properties is employed, a piezoelectric action caused by external vibrations may prevent effectively generation of noises because the foam layer 26 can act as a cushioning material. However, where the thickness of the plastic film 22 having pyroelectric properties is rendered so thin as illustrated in FIG. 2 to improve its pyroelectric performance, the surface of the plastic film becomes so curved or waved that an infrared image to be focused thereon by a condensing lens or a concave mirror (not shown) provided in front of the plastic film 22 becomes faded or blurred and consequently the sensitivity of the electric element is decreased to a remarkable extent.

Where the known electric element 20 containing the plastic film 22 having piezoelectric properties is applied to an acoustic transducer, the generation of noises may be prevented as in instances where it is applied to the infrared sensor as set forth hereinabove. However, where the thin plastic film as shown in FIG. 2 is employed to improve the piezoelectric property of the film with respect to sounds, the film surface becomes so waved that the thin film may tend to convert sounds coming onto the film surface electroacoustically in a warped state.

In accordance with the known structure as shown in FIG. 2, the plastic film 22 is bonded to the waved or curved surface of the foam layer 26 through an adhesive layer 28 so that adhesion of the plastic film to the foam layer may tend to cause a lack of uniformity. Accordingly, when the plastic film often vibrates, stresses may tend to concentrate so locally that the electrode layer 24 formed by deposition or other procedures on the film with a relatively weak force may tend to come off easily.

Where the known laminated electric element 20, as shown in FIG. 2, is applied to an infrared sensor or an acoustic transducer, another electrode layer is often provided additionally on the surface of the plastic film 22. In the case of the infrared sensor, said another electrode layer may be a transparent electrode of, for example, indium oxide, capable of penetrating infrared rays.

Figure 3:
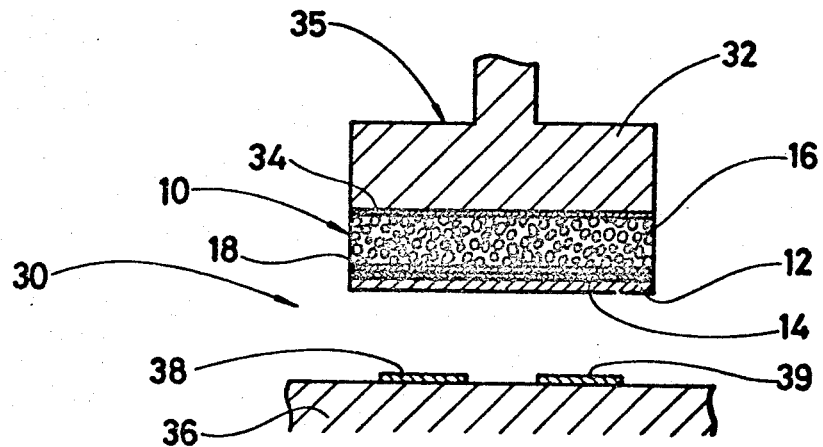
FIG. 3 is a longitudinal cross sectional view illustrating the known laminated electric element of FIG. 1, when applied to a capacitive switch.

FIG. 3 illustrates an example where the known electric element 10 of FIG. 1 is applied to a capacitive switch 30. A switch key 35 constituting the capacitive switch is composed of a key stem 32 on which the known electric element 10 is fixed through an adhesive layer 34. The switch key is mounted to a machine frame (not shown) which provides an upward and downward movement, when observed on FIG. 3, or reciprocal movement. Underneath the switch key, there is disposed a plate 36 having a pair of an input stationary electrode 38 and an output stationary electrode 39 so as to be faced opposite to the plastic film 12 of the known electric element 10 fixed on the key stem 32.

In FIG. 3, when the switch key 35 is pressed down toward the plate 36 so as to bring the electric element 10 into contact with the plate, a capacitive coupling is provided between the input electrode 38 and the output electrode 39 through the electrode layer 14 in the electric element 10 and consequently a circuit is closed between the pair of the stationary electrodes. In this case, the thinner the thickness of the plastic film 12, the greater the electric capacity at the time of contact, and the higher the dielectric constant of the film, the greater the electric capacity. Accordingly, the known electric element 10 which contains a thick plastic film is not preferred for use with a capacitive switch. In this respect, the known electric element 20 as shown in FIG. 2 which contains a thin plastic film is more suitable for a capacitive switch than another known electric element 10. However, the known laminated electric element 20 having a thin plastic film as shown in FIG. 2 may cause a risk that a desired electric capacity for a capacitive switch cannot be produced at the time of contact because the surface of the film 22 is so waved or curved that an air layer is formed between the wavy surface of the plastic film and the stationary electrodes.

In accordance with the known laminated structures as shown in FIGS. 1 to 3, a repetition of switching operations by means of the switch key 35 produces the repeated generation of stresses in the plastic film, whereby the electrode layer formed by deposition or other procedures may tend to come off, as in the case of the aforesaid acoustic transducer.

The laminated electric elements in accordance with the present invention can efficiently overcome the drawbacks and disadvantages of the known laminated electric elements as shown in FIGS. 1 to 3.

Figure 4:
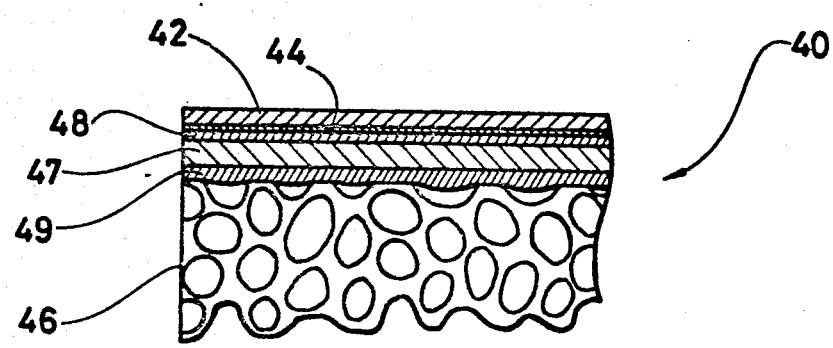
FIG. 4 is a longitudinal cross sectional view illustrating a portion of an example of the laminated electric element in accordance with the present invention.

In FIG. 4, the laminated electric element 40 in accordance with the present invention comprises a middle layer 47 disposed and interposed between a metallized or conductive layer-carrying plastic film and a foam layer 46. The metallized or conductive layer-carrying plastic film is composed of the plastic film 42 provided or deposited on at least one surface thereof with a conductive layer or metal film, i.e., the electrode layer 44. The middle layer may be bonded to the metallized plastic film and the foam layer through adhesive layers 48 and 49, respectively, as shown in FIG. 4.

The middle layer 47 may be preferably formed in a film or sheet having a flat surface, which is composed of a relatively soft or flexible synthetic resin, such as polyolefins, e.g., polyethylene or polypropylene; polystyrene; polymethyl methacrylate; polyacrylonitrile; polyamides; polyesters; polycarbonates; low plasticized polyvinyl chloride; low plasticized vinylidene chloride-vinyl chloride copolymers; polyvinyl fluoride; polyvinylidene chloride; polyethylene trifluoride; mixtures thereof or any other suitable resins having a Young's modulus equivalent to or higher than those of the aforesaid resins. The middle layer 47 may be formed in a single layer or in a multilayer which in turn is composed of a single material or a mixture thereof, selected from the aforesaid materials.

Although the thickness of the middle layer 47 is not particularly restricted, it is preferred to use the middle layer having a thickness ranging from about 10 microns to about 100 microns. Where the middle layer is too thick, a cushioning effect to be provided on the plastic film by the foam layer 46 may be impaired. Where the middle layer is used which is composed of a material having a too low Young's modulus or where it is too thin, the interposition of the middle layer between the metallized plastic film and the foam layer cannot provide the effect as desired. It is further preferred that the middle layer is used which has a thickness thicker than the plastic film 42, whereby the surface of the film is maintained or rendered flat when laminated on the foam layer having an inwardly and outwardly curved or waved surface.

The provision of the middle layer 47 may be effected by various methods which are known per se. The middle layer may be bonded to the metallized or conductive layer-carrying plastic film with an adhesive layer 48 by first coating the adhesive on the surface of the metallized plastic film or on the surface of the middle layer and then superposing the middle layer on the film, and the middle layer thus bonded is further bonded to the foam layer 46 in substantially the same manner as immediately hereinabove set forth. The lamination may also be effected by first coating an adhesive on one surface or both surfaces of the middle layer and then superposing the metallized plastic film and/or the foam layer. A double-adhesive tape or sheet may be employed which can act as the middle layer 47 having the adhesive layers 48 and 49 on both of the surfaces thereof. It also may be possible to use a single-adhesive tape or sheet which can function as the middle layer having either of the adhesive layers 48 and 49 on one surface thereof. In this case, the single-adhesive tape or sheet is first bonded to either of the metallized plastic film and the foam layer and then bonded to the other non-bonded thereto through an adhesive layer coated on the other surface of the tape or sheet or of the other. As the double-adhesive or single-adhesive tape or sheet, there may be employed a polyester film having a thickness of about 20 microns with an adhesive layer or layers having each a thickness of about 15 microns, although it is practically preferred to use the tape or sheet having generally a thickness of more than 100 microns. Although the double-adhesive tape or sheet may sometimes cause the problem with an airtight adhesion to the metallized plastic film because the adhesive layer involved may tend to become so porous that the metal electrode layer 44 may be corroded, it is convenient to use the double-adhesive tape or sheet because the steps of coating the adhesive layers 48 and 49 can be saved.

The plastic film 42 may be of a dielectric material or, if needed, of a dielectric material having a combination of pyroelectric, piezoelectric or any other electric properties. Such material may include, for example flexible or soft synthetic resins, such as thermoplastic polyester; polyolefins, e.g., polyethylene or polypropylene; polyamides; polycarbonates; polyvinyl halides, e.g., polyvinyl chloride or polyvinyl fluoride; polyvinylidene fluoride; polyolefin halides, e.g., polyethylene trifluoride or polyethylene tetrafluoride; mixtures thereof or other plastics. The plastic film may be composed of a single layer or a multilayer which in turn is formed by a single material or a mixture of materials as hereinabove set forth.

The plastic film may vary in thickness with Young's modulus. Where a film having a low Young's modulus and a thickness thinner than about 20 microns is employed, it may be hard to render the surface of the film flat when laminated on the curved surface of the foam layer. A film having a high Young's modulus and a thickness thinner than about 10 microns may also make it difficult to keep the surface of the film flat on the curved surface of the foam layer. Further, where a film having a thickness of more than about 25 microns is used in either case, the metallized plastic film undergoes no or little influence from the curved or waved surface of the foam layer even if no middle layer would be provided as in FIG. 1. It is generally convenient to use the plastic film having a thickness within the scope ranging from about 10 to 25 microns according to the Young's modulus of the material to be used for the plastic film. The Young's modulus of the material for the plastic film may range from about 30 kg/mm$^2$ to about 800 kg/mm$^2$ and, preferably, higher than about 50 kg/mm$^2$.

The plastic film 42 is provided on at least one surface thereof with a conductive layer or metal film, i.e., the electrode layer 44 composed of a metal, such as nickel, aluminum or gold. The electrode layer may be deposited on the surface of the plastic film by deposition or other suitable procedures. Where the electrode layer is required to have the penetrability of a light such as infrared rays, the layer may be composed of a transparent metal oxide, such as indium oxide. The electrode layer may be composed of a material capable of absorbing the light, such as gold black or carbon black. The electrode layer may have practically a thickness generally ranging from about 500 to 2,000 Angstroms, although the thickness of the layer is not limited thereto.

The foam layer 46 may be composed of any elastic foam, such as plastic foams, e.g., polyurethane foam or other plastic foams; natural or synthetic rubber foams; or any other suitable plastic foam. The foam may be of closed-cell material or of open-cell material. Although the thickness of the foam layer is not restricted to a particular one, it is practical to use a foam having a thickness ranging from about 1 to 10 mm.

The adhesive layers 48 and 49 may be composed of conventional adhesives, such as vinyl acetate resins; epoxy resins; acrylic resins; urethane resins; mixtures thereof or any other suitable adhesives. They may be practically in a thickness ranging from about 5 to 60 microns in each case. Where the adhesive layer 49 is composed of a solution adhesive, the adhesive may be absorbed in the porous foam layer 46 so that in this case the solution adhesive is coated first on the middle layer 47 and then the middle layer is allowed to adhere to the foam layer 46 after volatilization of the solvent of the solution adhesive.

The laminated electric elements in accordance with the present invention as having a laminated structure shown in FIG. 4 can utilize the electric properties of the metallized plastic films effectively. It is to be noted that the electric element of the present invention can render the metallized plastic film thin because the the provision of the middle layer can prevent the metallized or conductive layer-carrying plastic film from being curved or waved along with or resulting from the curved or waved surface of the foam layer. In the laminated electric elements according to the present invention, the electrode layer is protected by the flat middle layer or film so that the material for the electrode layer is protected against corrosion even in an atmosphere in which corrosion may tend to occur.

Figure 5:
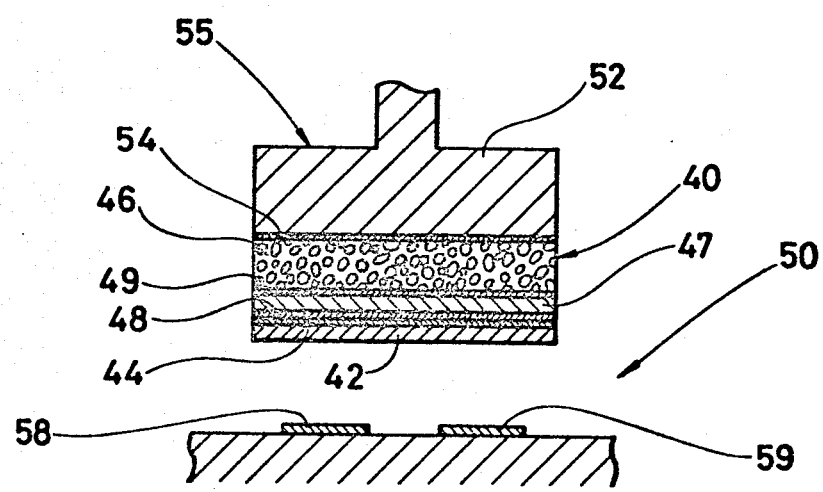
FIG. 5 is a longitudinal cross sectional view illustrating the laminated electric element of FIG. 4, when applied to a capacitive switch.

FIG. 5 illustrates a capacitive switch 50 containing the electric element 40 as shown in FIG. 4. In the capacitive switch, a switch key 55 is constituted by fixing the laminated electric element 40 to the bottom surface of a key stem 52 through an adhesive layer 54. The switch key 55 is mounted to a machine frame (not shown) so as to permit an upward and downward movement, when observed on FIG. 5, or reciprocal movement. This reciprocal movement may include any arbitrary movement, such as a linear reciprocal movement or a circular reciprocal movement. Underneath the switch key, a plate 56 provided with an input stationary electrode 58 and an output stationary electrode 59 is fixed to the machine frame so as to arrange the stationary electrode to face the plastic film 42 of the laminated electric element 40 attached to the switch key 55.

The switch stem 52 may be in any form, such as a square form or a rectangular form, on its bottom surface on which the electric element is mounted. Accordingly, the laminated electric element 40 to be attached thereto may be in any form corresponding to the form of the switch stem. The switch stem may be formed with any hard material, such as any hard synthetic resins, e.g., polyamide resins (Nylon, etc) or polyacetals. The adhesive layer 54 may be composed of any adhesive in a manner as described with respect to the adhesive layers 48 and 49.

The stationary electrodes 58 and 59 may be in any form, such as a square form or a rectangular form or in a tooth form in which the teeth portions of the two toothed electrodes are arranged so as to be engageable with or to be disposed between each other. The stationary electrodes may be composed of any conductive material, such as those as employed for the electrode layer 44 and may be formed by deposition or other suitable procedures for forming print wiring. The electrodes may be covered with a plastic or any other dielectric material as used for the plastic film 42. In this case, the electrode layer 44 may be formed on the outer surface of the plastic film 42.

As shown in FIG. 5, the switch key 55 is moved downwardly to bring the plastic film 42 into contact with a pair of the stationary electrode plates 58 and 59, whereby the film permits a capacitive coupling with the electrodes and thus a circuit between the pair of the electrodes is closed.

Mention will be further made of embodiments on the laminated electric elements in accordance with the present invention, when applied to a capacitive switch as shown in FIG. 5, with comparison to the known laminated electric element as shown in FIG. 2 when applied to a capacitive switch.

The laminated electric element 40 in accordance with the present invention, as shown in FIGS. 4 and 5, are composed of a polyester film 42 having a thickness of about 2 microns on one side of which is formed an aluminum electrode layer 44 having a thickness of 1,000 Angstroms by deposition procedures. On the surface of the electrode layer is bonded a polypropylene film 47 having a thickness of 20 microns with a vinyl acetate resin type adhesive layer 48 in a thickness of about 10 microns. This middle layer 47 is then bonded to a polyurethane foam layer 46 having a thickness of 4 mm through an adhesive layer 49 having an average thickness of about 15 microns to provide a laminated electric element as shown in FIG. 4. This electric element is then bonded to a switch stem 52 through an adhesive layer 54 and assembled with a plate with a pair of the input and output stationary electrodes 58 and 59 having each an area of 0.43 cm$^2$, respectively, whereby a capacitive switch 50 as shown in FIG. 5 is formed. The respective OFF and ON switch capacities of the capacitive switch as formed hereinabove were 2 pF and 200 pF.

As a comparison, the laminated electric element 20, as shown in FIGS. 2 and 3, was prepared in substantially the same manner as hereinabove set forth with the exception that the adhesive layer 28 had an average thickness of about 15 microns and no middle layer was formed. A capacitive switch as shown in FIG. 3 was likewise formed with the electric element 20. Its respective OFF and ON switch capacities were 2 pF and 30 pF.

It is now found from the comparative results that the capacitive switch containing the laminated electric element in accordance with the present invention had a remarkably improved OFF capacity as compared to the known capacitive switch as shown in FIG. 3. It is further found that, when the respective switch keys 55 and 35 as prepared hereinabove were observed visibly from the bottom surface, the film 42 of the laminated electric element in accordance with the present invention provided an extremely flat surface without any deviation in a mirror image formed thereon, whereas the plastic film on the known capacitive key provided a surface having a number of upward and downward small wavel-like curvatures with a mirror image deviated from the correct image and warped or deflected to a remarkable extent.

The laminated electric elements in accordance with the present invention can be applied to a capacitive switch, a piezoelectric instrument, such as an acoustic transducer, a pyroelectric instrument, such as an infrared sensor, and any other suitable device or instrument.

While the present invention is illustrated with specific embodiments, it will be recognized by those having an ordinary skill in the art that any variation thereon and modification therefrom may be made therein without departing from the scope of the present inventive concepts of the present invention as defined by the following claims.

What is claimed is:

1. In a laminated electric element comprising a plastic film of a dielectric material provided on at least one side thereof with a conductive layer and a foam layer, the improvement in which a middle layer is disposed between the plastic film and the foam layer and is fixed to each by means of an adhesive to thereby provide a flat surface on the plastic film.

2. The laminated electric element according to claim 1, wherein the middle layer is composed of a single layer.

3. The laminated electric element according to claim 1, wherein the middle layer is composed of a multilayer.

4. The laminated electric element according to any one of claims 1 to 3, wherein said adhesive affixing the middle layer to the plastic film and the foam layer is in the form of layers.

5. The laminated electric element according to any one of claims 1 to 3, wherein the middle layer is composed of material having a Young's modulus ranging from about 30 to 80 kg/mm$^2$.

6. The laminated electric element according to claim 5, wherein the middle layer is composed of a polyolefin, such as polyethylene or polypropylene, polystyrene, polymethyl methacrylate, polyacrylonitrile, a polyamide, a polyester, a polycarbonate, a low plasticized polyvinyl chloride, a low plasticized vinylidene chloride-vinyl chloride copolymer, polyvinyl fluoride, polyvinylidene chloride, polyethylene trifluoride or a mixture thereof.

7. The laminated electric element according to any one of claims 1 to 3, wherein the middle layer has a thickness ranging from 10 to 100 microns.

8. The laminated electric element according to claim 1, wherein the plastic film is provided with a conductive layer between the plastic film and the foam layer.

9. The laminated electric element according to claim 1, wherein the plastic film is provided with a conductive layer on a surface opposite to the surface facing the foam layer.

10. The laminated electric element according to claim 1, wherein the plastic film is provided with a conductive layer on both surfaces thereof.

11. The laminated electric element according to any one of claims 1 and 8 to 10, wherein the plastic film is composed of a polyolefin, such as polyethylene or polypropylene, a polyamide, a polycarbonate, a polyvinyl halide, such as polyvinyl chloride or polyvinyl fluoride, polyvinylidene fluoride, a polyolefin halide, such as polyethylene trifluoride or polyethylene tetrafluoride, or a mixture thereof.

12. The laminated electric element according to claim 11, wherein the plastic film is provided with at least one property selected from piezoelectric and pyroelectric properties in addition to a dielectric property.

13. The laminated electric element according to any one of claims 1 and 8 to 10, wherein the plastic film has a thickness ranging from 10 to 25 microns.

14. The laminated electric element according to claim 1, wherein the conductive layer is an electrode layer.

15. The laminated electric element according to claim 14, wherein the electrode layer is composed of aluminum, gold, nickel, indium oxide or gold black.

16. The laminated electric element according to claim 14 or 15, wherein the electrode layer has a thickness ranging from 500 to 2,000 Angstroms.

17. The laminated electric element according to claim 4, wherein the adhesive layer is composed of a vinyl acetate resin type adhesive, an epoxy resin type adhesive, an acrylic resin type adhesive or a urethane type resin.

18. The laminated electric element according to claim 17, wherein the adhesive layer has a thickness ranging from 5 to 60 microns.

19. The laminated electric element according to claim 4, wherein a double-adhesive tape or sheet is used as the middle layer carrying an adhesive layer on each of the surfaces thereof.

20. The laminated electric element according to claim 4, wherein a single-adhesive tape or sheet is used as the middle layer carrying an adhesive layer on one surface thereof.

21. The laminated electric element according to claim 1, wherein the foam layer is composed of a plastic foam or a natural or synthetic rubber foam.

22. The laminated electric element according to claim 21, wherein the foam layer is composed of polyurethane foam.

23. The laminated electric element according to claim 1, 21 or 22, wherein the foam layer has a thickness ranging from 1 to 10 mm.

24. The laminated electric element according to claim 1, wherein the laminated electric element is mounted to a reciprocally movable member for mounting a movable electrode so as for the surface of the plastic film to face a pair of an input stationary electrode and an output stationary electrode.

25. The laminated electric element according to claim 24, wherein the laminated electric element is bonded with an adhesive to the reciprocally movable member.

26. The laminated electric element according to claim 24 or 25, wherein the stationary electrodes are coated with a dielectric layer and the plastic film is provided on the outer surface thereof with the electrode layer.

* * * * *